United States Patent [19]

Sugawara

[11] Patent Number: 5,337,050
[45] Date of Patent: Aug. 9, 1994

[54] SERIAL-TO-PARALLEL CONVERTER CIRCUIT

[75] Inventor: Mitsutoshi Sugawara, Tokyo, Japan

[73] Assignee: NEC Corporation, Tokyo, Japan

[21] Appl. No.: 14,780

[22] Filed: Feb. 8, 1993

[30] Foreign Application Priority Data

Feb. 13, 1992 [JP] Japan .................................. 4-026984

[51] Int. Cl.⁵ ........................................... H03M 9/00
[52] U.S. Cl. ................................................ 341/100
[58] Field of Search ............... 341/100, 101, 110, 106, 341/51

[56] References Cited

U.S. PATENT DOCUMENTS

| 3,823,397 | 7/1974 | Howard et al. | 341/100 |
| 4,686,691 | 8/1987 | Deal et al. | 377/54 |
| 5,146,577 | 9/1992 | Babin | 395/425 |
| 5,206,831 | 4/1993 | Wakamatsu | 365/200 |

Primary Examiner—Brian K. Young
Attorney, Agent, or Firm—Whitham, Curtis & Whitham

[57] ABSTRACT

A serial-to-parallel converter circuit includes a reduced number of gate circuits necessary to configure the circuit. In the converter, each of the register blocks is constituted with an R-S flip-flop circuit including two NAND gates and an NAND gate to select the flip-flop circuit. A decoder selects one of the register blocks according to an accumulation value of serial clocks received by a counter, thereby setting data received via a data input terminal to the selected register block.

3 Claims, 5 Drawing Sheets

F I G. 2A
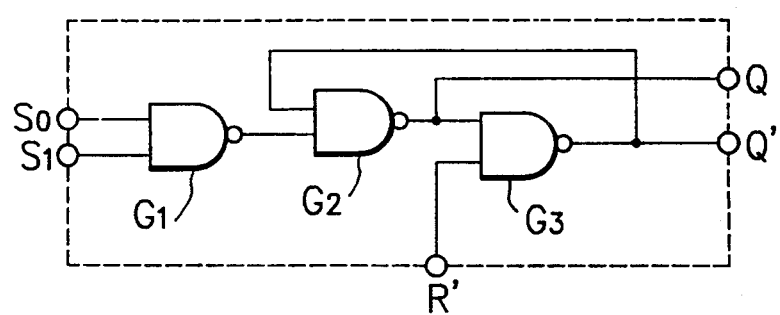

SERIAL-TO-PARALLEL CONVERTER CIRCUIT

BACKGROUND OF THE INVENTION

The present invention relates to a serial-to-parallel converter circuit, and in particular, to a serial-to-parallel converter circuit for receiving as inputs thereto serial data from an external device and outputting the input data in a parallel format.

Description of the Related Art

As a conventional serial-to-parallel converter circuit, these has been known a shift register as shown in FIG. 1 in which digital signals are received in a serial format and are then converted into parallel signals, thereby outputting the obtained signals. As can be seen from the constitution of FIG. 1, this circuit is an n-bit shift register constituted with n master-slave D flip-flop circuits in a cascade connection. Each of the flip-flop circuits F1 to Fn has a clock terminal C commonly connected to a serial clock input terminal CK.

In the master-slave flip-flop circuit, data is received via an input terminal D thereof during a period of time when the clock received by the clock terminal C is in a high state. When the clock delivered to the clock terminal C is changed to a low state, the date thus acquired from the input terminal D is latched therein and is outputted from an output terminal Q. In a case of a cascade connection including a plurality of master-slave flip-flop circuits, at an end of falling transition of the clock, data outputted from the output terminal Q of a flip-flop circuit is outputted from the output terminal of a flip-flop circuit in the subsequent stage. That is, in synchronism with the clock, the data outputted from the flip-flop circuit of the preceding stage is shifted to the output of the subsequent flip-flop circuit.

In consequence, receiving n clocks in a sequential manner, the conventional circuit shown in FIG. 1 successively shifts data supplied to a terminal IN to set the data to the output terminals Q1 to Qn, thereby outputting parallel signals from the terminals Q1 to Qn and reverse output terminals Q'1 to Q', not shown.

However, the conventional circuit is attended with a problem that the number of elements thereof is increased for the following reason. The master-slave D flip-flop circuit is constituted with six gate circuits, namely, six two-input NAND circuits; consequently, to configure a 256-bit serial-to-parallel converter circuit, there are required 1536 gate circuits.

On the other hand, recently, there has been broadly adopted a method, for example, in a DDB bus in which serial data is sent to each integrated circuit (ICs) of the system by use of a micro computer or the like so as to set the states of the respective ICs. In this case, in the section to receive the serial data, there is required a serial-to-parallel converter circuit to receive the necessary amount of serial data and to control the internal circuits in a parallel fashion. The shift register above has been employed as the converter; consequently, in the apparatus of this kind using the converter of the prior art, a large number of constituent elements are necessary to construct the system, which leads to a problem that the overall size and the power consumption of the apparatus are increased.

SUMMARY OF THE INVENTION

It is therefore an object of the present invention to provide a serial-to-parallel converter circuit in which the number of the constituent gate circuits can be reduced, thereby solving the problem above.

In accordance with the present invention, there is provided a serial-to-parallel converter circuit including a plurality of register blocks, each of the register blocks having a flip-flop circuit developing a function to keep therein data and to output therefrom the data and a gate circuit for receiving as inputs thereto two selection signals for selecting the flip-flop circuit and thereby selecting the flip-flop circuit, and an address decoder for receiving as an input thereto address data for selecting, in response to the address data, a predetermined register block from the plural register blocks in a manner similar to one specifying a matrix element.

In the serial-to-parallel converter circuit in accordance with the present invention, there are included a plurality of register blocks and each thereof is constituted with a flip-flop circuit configured with two gates and a gate circuit structured with one gate to select a flip-flop circuit. In association therewith, an address decode selects, according to address data received as an input thereto, one of the plural register blocks connected to each other in a matrix form so as to set the input serial data to the selected register block. With this provision, in the serial-to-parallel converter circuit in accordance with the present invention, the input serial data is kept in the plural register blocks so as to output the data from the register blocks in a parallel manner, thereby minimizing the number of gate circuits necessitated to configure the converter.

BRIEF DESCRIPTION OF THE DRAWINGS

The objects and features of the present invention will become more apparent from the consideration of the following detailed description taken in conjunction with the accompanying drawings in which:

FIG. 2A is a circuit diagram showing the structure of an R-S register employed in the serial-to-parallel converter circuit in a first embodiment in accordance with the present invention;

DESCRIPTION OF THE PREFERRED EMBODIMENTS

Figure 1:
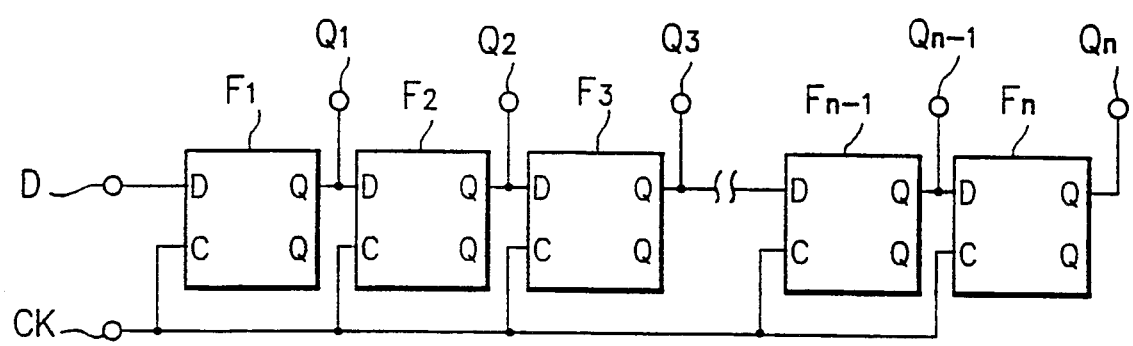
FIG. 1 is a schematic diagram showing the constitution of a conventional example of a serial-to-parallel converter circuit.

Referring now to the drawings, description will be given of embodiments in accordance with the present invention.

FIG. 2A shows the constitution of an R-S register adopted in a serial-to-parallel converter circuit in a first embodiment in accordance with the present invention. As shown in this circuit diagram, a set signal input terminal S0 is connected to an input terminal of an NAND gate G1; whereas, a set signal input terminal S1 is linked with another input terminal of the NAND gate G1. The gate G1 has an output terminal connected to an input terminal of an NAND gate G2. Another input terminal of the gate G2 and an output terminal of an NAND gate G3 are coupled with a reverse output terminal Q'. The NAND gate G2 has an output terminal connected to an input terminal of the gate G3, and these terminals are linked with an output terminal Q. Another input terminal of the gate G3 is coupled with a reset terminal R' of the negative logic.

In this configuration, the R-S register shown in FIG. 2A includes the NAND gates G2 and G3 constituting a general R-S flip-flop circuit. The NAND gate G1 is disposed on the set signal input side of the R-S flip-flop circuit. Depending on set signals inputted from the set signal input terminals S0 and S1, the R-S flip-flop circuit is selected.

Figure 2B:
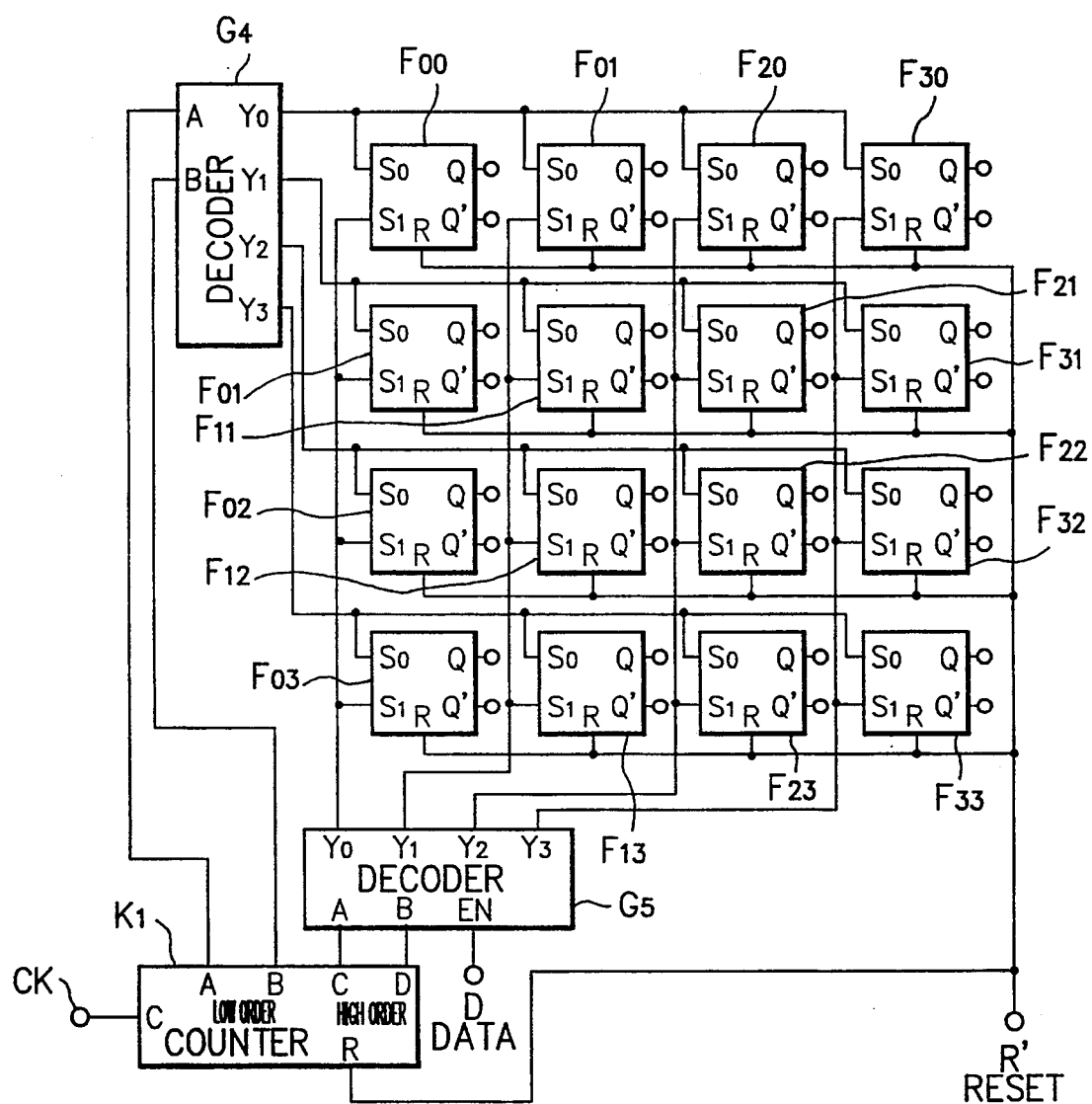
FIG. 2B is a circuit diagram showing the structure of the serial-to-parallel converter circuit in the first embodiment in accordance with the present invention.

FIG. 2B shown the configuration of a serial-to-parallel converter circuit in the first embodiment in accordance with the present invention. This embodiment is a 16-stage serial-to-parallel converter circuit including 16 register blocks F00 to F03, F10 to F13, F20 to F23, and F30 to F33. Each block includes the R-S register of FIG. 2A. The output terminals Q and the reverse output terminals Q' of the respective register blocks deliver the outputs of the converter circuit. Moreover, according to the converter of the first embodiment, a serial clock, serial data, and a reset signal are received as inputs thereto from a serial clock input terminal CK, a data input terminal D, and a reset input terminal R', respectively. In addition, the converter includes a counter K1 for receiving therein the serial clock and the reset signal and outputting an accumulated result of the serial clock and an address decoder constituted with decoders G4 and G5.

Subsequently, description will be given of the operation of the converter circuit of the first embodiment thus constructed. First, in an initial setting operation, a reset signal at a low level is delivered to the reset input terminal R' to reset the register blocks F00 to F03, F10 to F13, F20 to F23, and F30 to F33 and the counter K1. Next, the reset input terminal R' is set to a high level to release the reset state. When a serial clock is inputted thereafter from the serial clock input terminal C, the counter K1 accumulates the received clock in response thereto to produce a binary value associated with a result of accumulation such that two high-order bits and two low-order bits respectively of the result are fed to the decoders G4 and G5, respectively. Based on the binary values produced from the counter K1, the decoders G4 and G5 select one of the register blocks to set data thereto.

For example, when five serial clock pulses are inputted to the terminal CK, the counter K1 produces an accumulated value of "6" and the output terminals A and C thereof are set to a high state. Accordingly, "2" is inputted to the decoder G4 and only the output terminal T2 is set to a high level among the output terminals of the decoder G4. On the other hand, "1" is inputted to the decoder G5 and only the output terminal Y1 is set to a high state among the output terminals of the decoder G5. Resultantly, according to the outputs from the decoders G4 and G5, the data input terminals S0 and S1 are set to a high level only in the register block F12 among the register blocks, thereby setting data only to the block F12. When the data input terminal D is in a low state, the output from the decoder G5 does not select any one of the register blocks. Namely, data is not set to the block F12.

As above, in the converter circuit of the first embodiment, according to the sequence of the input serial clocks and the input data value, the register blocks are set or are kept reset such that the data is outputted at a time from the output terminals Q and Q' of each of the register blocks in a parallel fashion. Consequently, according to the converter circuit, since each register block thereof can be constituted with only three NAND gates, the number of gate circuits necessary to configure the converter is minimized as compared with the conventional system.

Figure 3A:
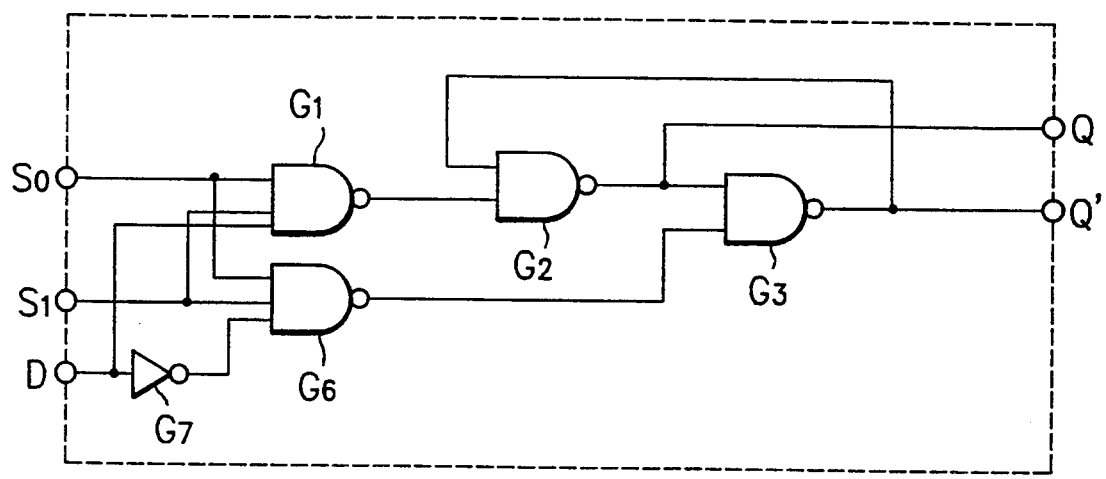
FIG. 3A is a circuit diagram showing an R-S register employed in the serial-to-parallel converter circuit in a second embodiment in accordance with the present invention.
Figure 3B:
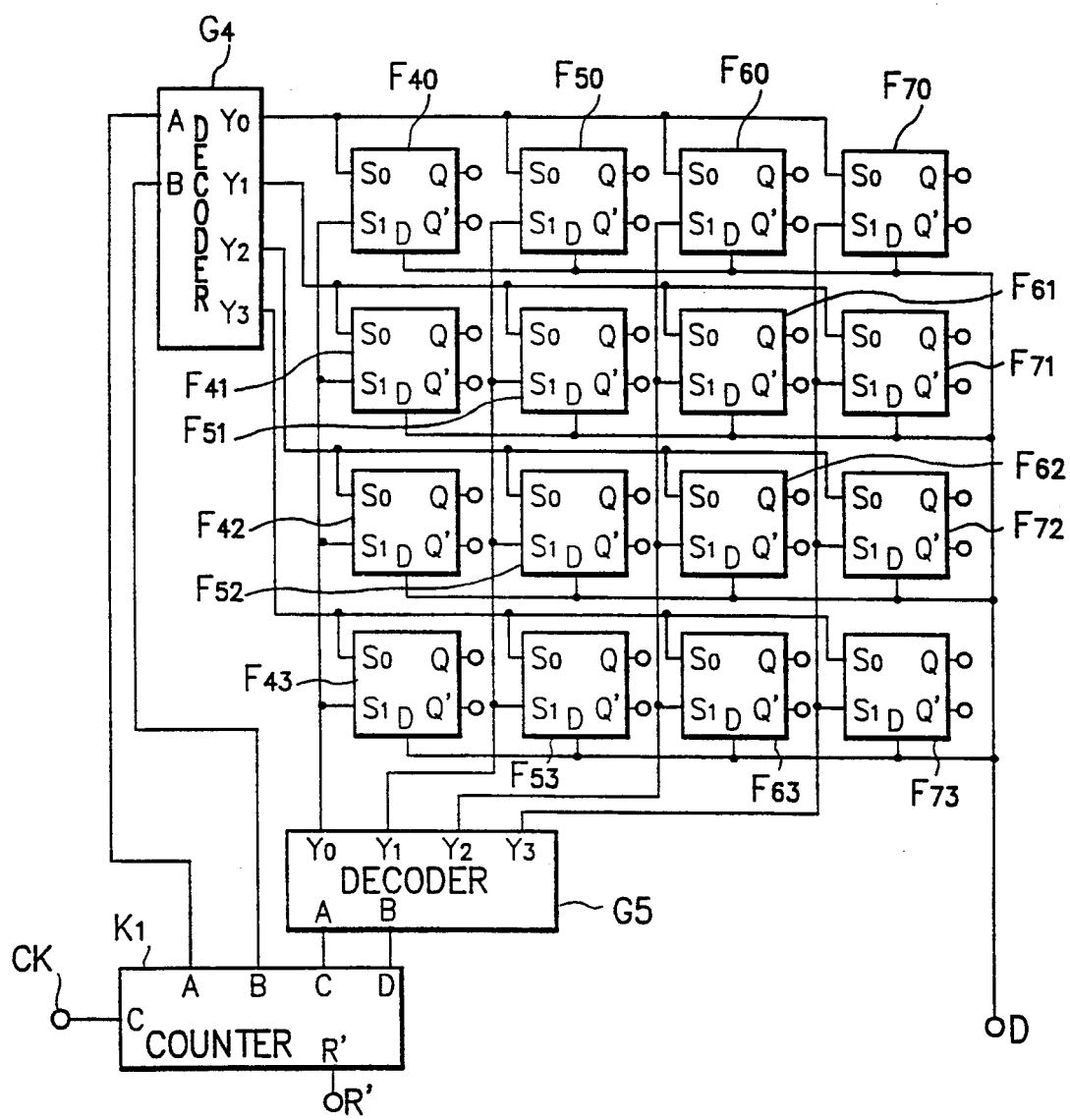
FIG. 3B is a circuit diagram showing the configuration of the serial-to-parallel converter circuit in the second embodiment in accordance with the present invention.

Referring now to the accompanying drawings, description will be given of the second embodiment in accordance with the present invention. FIG. 3A shows the circuit construction of an R-S register adopted in the serial-to-parallel converter circuit of the second embodiment; whereas, FIG. 3B shows the structure of the serial-to-parallel converter circuit of FIG. 3A. In these diagrams the constituent elements having the same functions as those of the first embodiment shown in FIGS. 2A and 2B are assigned with the same reference numerals and a redundant description thereof will be avoided.

As for constituent elements, the difference between the R-S registers respectively of FIGS. 3A and 2A resides in that the reset input terminal R' is not used and there are additionally installed in place thereof a data input terminal D, a three-input NAND gate G6, and an inverter G7. As a result, in operation of the R-S register shown in FIG. 3A, when the set signal input terminals S0 and S1 are set to a high level, the register is selected. In this state, the register can be set or reset depending on data supplied to the data input terminal D.

FIG. 3B shows a serial-to-parallel converter circuit of the second embodiment in which the R-S register of FIG. 3A is employed as each of the register blocks F40 to F43, F50 to F53, F60 to F63, and F70 to F73. The data input terminal D of the circuit is connected to the data input terminal D of each of the register blocks and the reset input terminal R' of the counter K1 is linked with the reset input terminal R' of the converter circuit. The other constitution is almost identical to that of the first embodiment shown in FIG. 2B.

The converter of the second embodiment accomplishes operations in substantially the same manner as the first embodiment. However, since the terminal R' of each register block is coupled with the terminal D in the second embodiment, it is possible to set or reset only an arbitrary one of the register blocks. Moreover, if the counter K1 is configured as a presettable unit, it is possible to load only the necessary data in a desired register block; furthermore, required data can be overlaid so as to use the system as a software register. In the converter circuit of the first embodiment, the reset input terminal R' of each register block is commonly connected to the reset input terminal R' of the converter circuit. Consequently although the register blocks can be reset at a time, it is impossible to reset only a desired one thereof.

In consequence, according to the converter circuit of the second invention, the number of gate circuits required to construct the converter can be minimized. In addition, it is possible to set or reset an arbitrary one of the register blocks.

In this regard, in the first and second embodiments, R-S registers are used as register blocks constituting the converter circuit. However, T flip-flop circuits, D latch circuits, JF flip-flop circuits, and the like may also be employed as register blocks. Moreover, as the address decoder of each register block, there may be adopted NAND gates, NOR gates, etc. In addition, although 4×4=16 register blocks are disposed in each of the first and second embodiments, there may be used 8×8=64, 8×16=128, or 16×16=256 register blocks in the same manner depending on designs.

As described above, in the serial-to-parallel converter circuit in accordance with the present invention, since the register block to keep a data item therein and to output the item therefrom can be constituted with three gates, the number of gate circuits is minimized, which in turn reduces the pellet size and the power consumption of the converter. For example, in the converter circuit in accordance with the present invention, when the counter, the decoder section, and the register block section respectively include 24, 12, 48 (3×16) gates, there are required 84 gates in total. As compared therewith. the conventional converter circuit requires 6×16=96 gates.

Particularly, in an integrated circuit of the system having a function to generate serial clocks, the counter section of the converter circuit in accordance with the present invention can be commonly used as the serial clock generating section of the converter circuit, which substantially minimizes the portion used for the purpose.

In the converter circuit in accordance with the present invention, there may be disposed the R-S flip-flop circuits actually necessary for the operation, for example, 50 flip-flop circuits may be arranged. As a result, the number of gates of the converter is much more minimized. This advantage is enhanced, particularly, as the number of register blocks used in the circuit is increased. For example, in a case of 256 stages of register blocks, there are conventionally required 256×6=1536 gates as described above; however, in the system in accordance with the present invention, there are necessitated 768 gates for the R-S flip-flop circuits and 124 gates for the decoders, namely, 892 gates in total. This means that in the structure of the circuit in accordance with the present invention, a reduction of 58% is possible in the number of gates constituting the converter circuit.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A serial-to-parallel converter circuit comprising:
a plurality of register blocks, each of the register blocks having a flip-flop circuit developing a function to keep therein data and to output therefrom the data and a gate circuit for receiving as inputs thereto two selection signals for selecting the flip-flop circuit; and
an address decoder for receiving as an input thereto address data for selecting, in response to the address data, a predetermined register block from the plurality of register blocks,
wherein the flip-flop circuit comprises and R-S flip-flop circuit including a first NAND gate and a second NAND gate, the gate circuit including a third NAND gate connected to a set signal input side of the R-S flip-flop circuit, and wherein the R-S flip-flop circuit is selected depending on set signals inputted to the third NAND gate,
wherein the address decoder includes:
a counter for receiving as inputs thereto a serial clock and a reset signal, for accumulating the serial clock, and for outputting a result of accumulation of the serial clocks; and
a first decoder and a second decoder.

2. A serial-to-parallel converter circuit comprising:
a plurality of register blocks, each of the register blocks having a flip-flop circuit developing a function to keep therein data and to output therefrom the data and a gate circuit for receiving as inputs thereto two selection signals for selecting the flip-flop circuit; and
an address decoder for receiving as an input thereto address data for selecting, in response to the address data, a predetermined register block from the plurality of register blocks,
wherein:
the flip-flop circuit comprises an R-S flip-flop circuit including a first NAND gate and a second NAND gate;
the gate circuit includes an inverter, a third NAND gate and a fourth NAND gate, each of the third and fourth NAND gates being connected on an input side of the R-S flip-flop circuit; and
the flip-flop circuit is enabled to be set or reset depending on data inputted to the inverter,
wherein the address decoder includes:
a counter for receiving as inputs thereto a serial clock and a reset signal, for accumulating the serial clock, and for outputting a result of accumulation of the serial clocks; and
a first decoder and a second decoder.

3. A serial-to-parallel converter circuit comprising:
a plurality of register blocks, each of the register blocks having a flip-flop circuit developing a function to keep therein data and to output therefrom the data and a gate circuit for receiving as inputs thereto two selection signals for selecting the flip-flop circuit; and
an address decoder for receiving as an input thereto address data for selecting, in response to the address data, a predetermined register block from the plurality of register blocks,
wherein said plurality of register blocks are coupled together to form a matrix.

* * * * *